US008274111B2

United States Patent
Kim

(10) Patent No.: US 8,274,111 B2
(45) Date of Patent: Sep. 25, 2012

(54) METHOD FOR FABRICATING A SEMICONDUCTOR MEMORY DEVICE HAVING A BURIED WORD LINE STRUCTURE

(75) Inventor: Han Nae Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 182 days.

(21) Appl. No.: 12/650,253

(22) Filed: Dec. 30, 2009

(65) Prior Publication Data
US 2011/0024815 A1 Feb. 3, 2011

(30) Foreign Application Priority Data
Jul. 31, 2009 (KR) ................. 10-2009-0070638

(51) Int. Cl.
*H01L 29/66* (2006.01)
*H01L 21/336* (2006.01)
(52) U.S. Cl. ............... 257/330; 257/332; 257/E21.177; 438/270
(58) Field of Classification Search .............. 257/302, 257/334, E21.627, E21.629, E27.016; 438/270, 438/239
See application file for complete search history.

(56) References Cited

U.S. PATENT DOCUMENTS

| | | | |
|---|---|---|---|
| 6,566,190 B2* | 5/2003 | Lee et al. | 438/242 |
| 2007/0096185 A1* | 5/2007 | Kim et al. | 257/301 |
| 2007/0155119 A1* | 7/2007 | Muemmler et al. | 438/424 |
| 2008/0073706 A1* | 3/2008 | Hayashi | 438/270 |
| 2009/0321805 A1* | 12/2009 | von Kluge et al. | 257/330 |
| 2010/0240184 A1* | 9/2010 | Jung et al. | 438/270 |

FOREIGN PATENT DOCUMENTS

| | | |
|---|---|---|
| KR | 1020030006542 A | 1/2003 |
| KR | 1020070032469 A | 3/2007 |
| KR | 100724572 B1 | 5/2007 |
| KR | 1020070071617 A | 7/2007 |

* cited by examiner

*Primary Examiner* — Matthew Landau
*Assistant Examiner* — Khaja Ahmad

(57) ABSTRACT

A method for fabricating a semiconductor apparatus including a buried gate removes factors deteriorating the operational reliability of the semiconductor device such as the electrical connection between a contact and a word line, and increases a processing margin when forming the contact disposed on a source/drain region. The method includes forming a recess in a semiconductor substrate, forming a gate in a lower portion of the recess, forming a first insulation layer over the gate, growing silicon over the first insulation layer in the recess, and depositing a second insulation layer over the semiconductor substrate and in the remaining portion of the recess.

14 Claims, 6 Drawing Sheets

METHOD FOR FABRICATING A SEMICONDUCTOR MEMORY DEVICE HAVING A BURIED WORD LINE STRUCTURE

CROSS-REFERENCE(S) TO RELATED APPLICATIONS

Priority to Korean Patent Application No. 10-2009-0070638, filed on Jul. 31, 2009, which is incorporated herein by reference in its entirety, is claimed.

BACKGROUND OF THE INVENTION

The present invention relates to a method for fabricating a highly integrated semiconductor apparatus, and more particularly, to a method for fabricating a semiconductor device having a buried word line structure capable of stably operating in a highly integrated semiconductor memory apparatus.

In general, a semiconductor memory apparatus includes a plurality of unit cells each of which consists of a capacitor and a transistor. The capacitor is used to temporarily store data, and the transistor is used to transmit data between a bit line and the capacitor in response to a control signal, e.g., a voltage level of a word line, using a property of semiconductor whose electrical conductivity changes depending on the environment. The transistor includes three regions of a gate, a source and a drain, and charge movement between the source and the drain occurs depending on the control signal inputted to the gate. The charge movement between the source and the drain is performed through a channel region.

In case of forming a typical transistor using a semiconductor substrate, a gate is formed on the semiconductor substrate, and a source and a drain are formed by doping impurities into portions of the semiconductor substrate at both sides of the gate. However, as the data storage capacity and a degree of integration of a semiconductor memory apparatus increase, a size of each unit cell is being required to be smaller. That is, the design rule of a capacitor and a transistor included in the unit cell has been reduced, and thus a channel length of the cell transistor has been gradually decreased. As a result, a short channel effect and drain induced barrier lower (DIBL) have occurred in the typical transistor, which deteriorated the operational reliability of the transistor. The above drawbacks occurring as a result of the reduction of the channel length can be overcome by maintaining a threshold voltage to allow the cell transistor to perform a normal operation. In general, as the channel length of the transistor has been smaller, the doping concentration of impurities in a region where a channel is formed has been increased.

However, as the design rule goes less than 100 nm, the doping concentration in the channel region is further increased as much as the extent to which the reduction of the design rule increases an electric field in a storage node (SN) junction. As a result, it may cause another drawback that a refresh property of the semiconductor memory apparatus is deteriorated. To overcome this drawback, a cell transistor having a three-dimensional channel structure is employed to maintain a channel length thereof although the design rule is reduced. In such a three-dimensional channel structure, a long channel is formed in a vertical direction. Namely, since the channel length is secured in the vertical direction although a channel width is small in a horizontal direction, the doping concentration may be reduced, and thus the deterioration of the refresh property may be minimized.

Meanwhile, as the degree of integration of the semiconductor memory apparatus is getting higher, a distance between a bit line and a word line that are coupled to the cell transistor becomes smaller. As a result, parasitic capacitance generated between the bit line and the word line increases, and the increasing parasitic capacitance deteriorates an operational margin of a sense amplifier amplifying data transmitted through the bit line. This is fatal to the operational reliability of the semiconductor memory apparatus. In order to solve the above drawbacks, a buried word line structure has been introduced to reduce the parasitic capacitance between the bit line and the word line. In the buried word line structure, the word line is formed only in a recess and not exposed over the surface of the semiconductor substrate. That is, the word line is buried in the semiconductor substrate by forming a conductive material in the lower part of a recess formed in the semiconductor substrate and covering the upper part of the recess with an insulation layer. As a result, the word line can be electrically isolated from the bit line formed on the semiconductor substrate in which source/drain is formed.

FIG. 1 is a cross-sectional view illustrating a semiconductor device having a buried gate in a typical semiconductor apparatus.

Referring to FIG. 1, an isolation layer 104 defining an active region is formed in a semiconductor substrate 102 through a shallow trench isolation (STI) method. After forming an insulation layer 106 on the active region and the isolation layer 104, a recess (not shown) for forming a gate pattern is formed through an exposure process. Subsequently, a buried gate 108 is formed by filling a lower portion of the recess with conductive material, and a nitride layer 110 is deposited in an upper portion. Then, although it is not shown, a bit line contact is formed to be coupled between two neighboring buried gates 108 formed in the active region by patterning the nitride layer 110, and a storage node contact is formed between the buried gate 108 and the isolation layer 104.

Particularly looking at a process of forming the buried gate 108, after depositing the conductive material on the semiconductor substrate 102 including the recess, the conductive material is planarized until the top surface of the insulation layer 106 is exposed by performing a chemical mechanical polishing (CMP) process. After then, an etch-back process is performed using the difference between an etch rate of the insulation layer 106 and that of the conductive material so that the conductive material remains in the lower portion of the recess. As a result, the buried gate 108 is formed. Subsequently, the nitride layer 110 is deposited on the buried gate 108.

The semiconductor device fabricated through the above processes has problems caused by a property of the etch-back process that is performed to form the buried gate 108 described in FIG. 1. That is, the conductive material filled in the upper portion of the recess is not fully planarized but remains on a sidewall of the recess, so that the conductive material can be removed only at the center of the recess as much as the etch depth. In the case that the semiconductor device is fabricated with allowing the conductive material to remain on the sidewall of the recess, if a voltage is supplied to the word line, an electric field may be concentrated on the conductive material remaining on the sidewall of the recess. Therefore, when using such a semiconductor device as a cell transistor, an operational property of a unit cell may be deteriorated by the electric field, and a data storage time may be also shortened by a leakage current generated by the electric field.

Moreover, if the conductive material is not completely removed from the sidewall of the recess, a problem may occur that a bit line contact formed in a subsequent step is electrically coupled with the conductive material. This phenomenon may occur in a process of forming a storage node contact and the bit line contact as well. The junction failure that the buried gate 108, i.e., the word line, is electrically coupled with the bit line contact or the storage node contact may deteriorate the operational reliability of a semiconductor device.

SUMMARY OF THE INVENTION

An embodiment of the present invention is directed to a semiconductor device and a method for fabricating the same, capable of removing factors that may deteriorate the operational reliability of the semiconductor device such as the electrical connection between a contact and a word line, and increasing a processing margin when forming the contact disposed on a source/drain region, by removing a conductive material remaining on a sidewall of a recess on a buried gate and growing silicon on the buried gate, when fabricating the semiconductor device including the buried gate.

In accordance with an embodiment of the present invention, a method for fabricating a semiconductor apparatus includes forming a recess in a semiconductor substrate, forming a gate in a lower portion of the recess, forming a first insulation layer over the gate, growing silicon over the first insulation layer in the recess, and depositing a second insulation layer over the semiconductor substrate and in the remaining portion of the recess.

The method may further include forming an isolation layer defining an active region in the semiconductor substrate.

The method may further include forming source/drain regions at both sides of the recess formed in the active region, forming a contact over the source/drain regions, and forming a capacitor or a bit line over the contact.

The growing of the silicon over the first insulation layer in the recess may include exposing the silicon on a sidewall of the recess by cleaning a portion over the first insulation layer in the recess, and selectively epitaxial-growing the exposed silicon.

The forming of the gate in the lower portion of the recess may include depositing a conductive material in the recess, performing an etch-back process to remove the conductive material in an upper portion of the recess, and cleaning the upper portion of the recess after performing the etch-back process.

The forming of the gate in the lower portion of the recess may further include depositing a barrier metal layer in the recess.

The barrier metal layer may include tungsten nitride, and the conductive material may include tungsten.

The forming of the first insulation layer over the gate may include depositing an insulating material over the gate, remaining the insulating material over the gate in a certain thickness by performing an etch-back process, thereby forming the first insulation layer, and cleaning the remaining portion of the recess after the etch-back process.

The certain thickness may be determined depending on a depth of the source/drain region.

The first insulation layer may include an oxide layer or a nitride layer, and a thickness of the first insulation layer may be at least approximately 10 Å to approximately 200 Å.

The gate may be formed in a depth from a range of approximately 1100 Å to approximately 1300 Å to a range of approximately 300 Å to approximately 400 Å from the top surface of the semiconductor substrate.

The recess may have the minimum line width in the cause of the design rule, and the line width of the recess may be reduced up to maximum 80% after growing the silicon.

In accordance with another embodiment of the present invention, a semiconductor apparatus includes a gate formed in a recess that is formed in a semiconductor substrate, an insulation layer formed in the recess over the gate, and a source/drain region including a silicon region extending onto the insulation layer in the recess and the semiconductor substrate.

The semiconductor apparatus may further include an isolation layer formed in the semiconductor substrate to define an active region, a contact coupled with the source/drain region, and a bit line and a capacitor formed on the contact.

A thickness of the insulation layer may be determined depending on a depth of the source/drain region.

The insulation layer may include an oxide layer or a nitride layer, and the thickness of the insulation layer may be at least approximately 10 Å.

The gate may be formed in a depth from a range of approximately 1100 Å to approximately 1300 Å to a range of approximately 300 Å to approximately 400 Å from the top surface of the semiconductor substrate.

The gate may include tungsten and may be surrounded by a barrier metal layer including tungsten nitride.

The recess may have the minimum line width in the cause of the design rule, and the silicon region may reduce a line width at an upper portion of the recess up to maximum 80%.

DESCRIPTION OF SPECIFIC EMBODIMENTS

Figure 1:
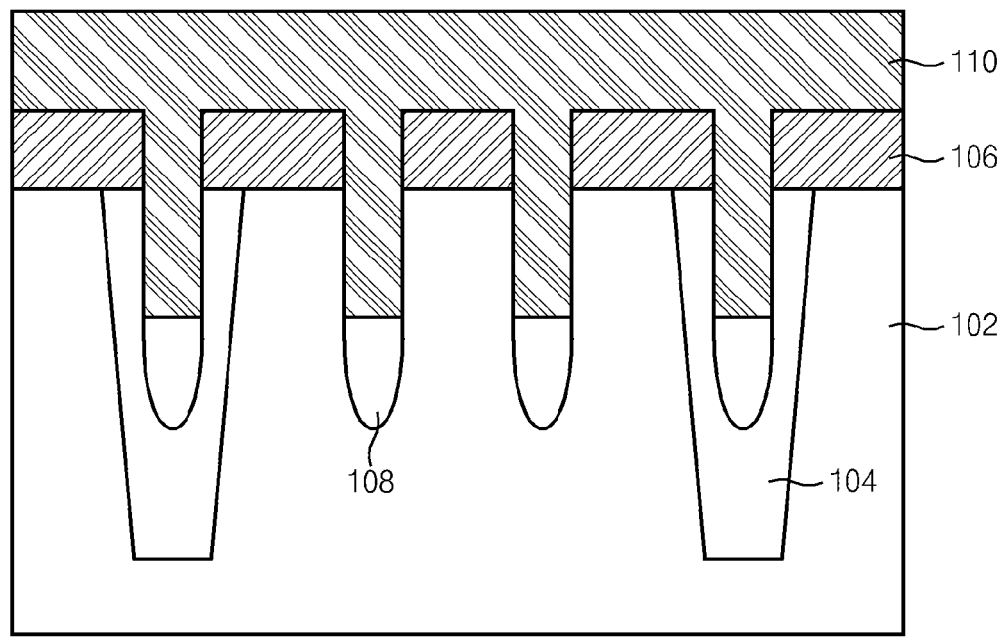
FIG. 1 is a cross-sectional view illustrating a semiconductor device having a buried gate in a typical semiconductor apparatus.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

An embodiment of the present invention illustrates a semiconductor memory apparatus including a buried gate. In particular, a method for fabricating a semiconductor device in accordance with the embodiment of the present invention is technology capable of enhancing the operational performance of the semiconductor device by reducing a leakage current and parasitic capacitance between a word line and a bit line as being applied to a cell transistor constructing a unit cell in the semiconductor memory apparatus.

FIGS. 2a to 2h are cross-sectional views and a plan view illustrating the method for fabricating a semiconductor device in accordance with an embodiment of the present invention.

Figure 2A:
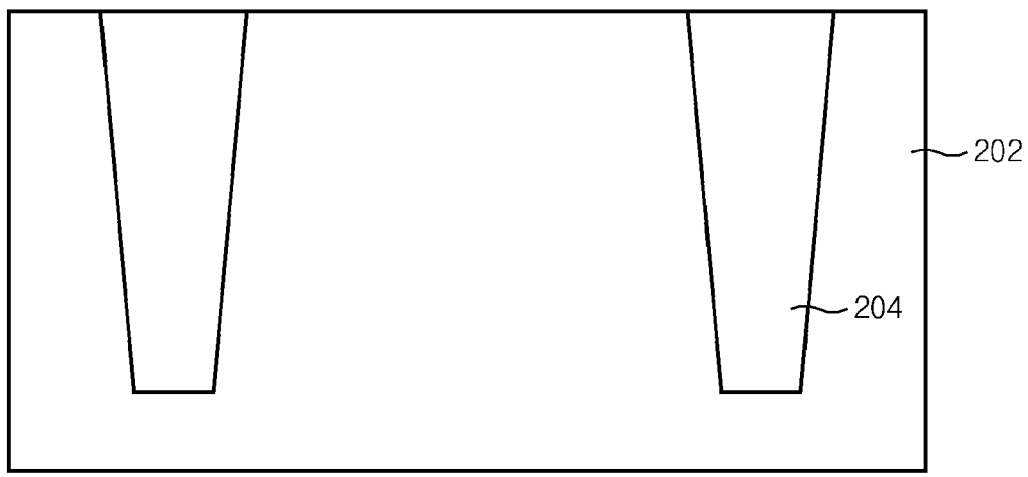
FIGS. 2a to 2h are cross-sectional views and a plan view illustrating a method for fabricating a semiconductor device in accordance with an embodiment of the present invention.

Referring to FIG. 2a, an isolation layer 204 defining an active region is formed in a semiconductor substrate 202 by employing a shallow trench isolation (STI) method. A depth of the isolation layer 204 formed in the semiconductor substrate 202 may be about 3000 Å.

Figure 2B:
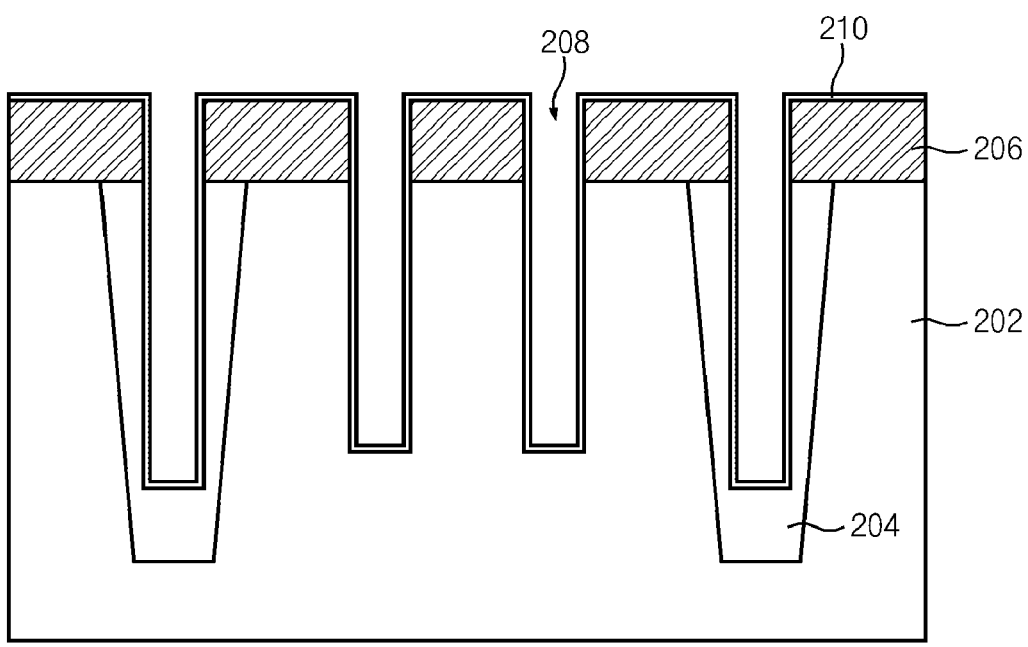

Referring to FIG. 2b, a first insulation layer 206 is deposited on the active region and the isolation layer 204. Although it is not shown, after coating photoresist (not shown) on the first insulation layer 206, the photoresist is patterned by performing an exposure process using a mask defining a position where a buried gate is to be formed. An exposed portion of the first insulation layer 206 is removed on the basis of the patterned photoresist. Subsequently, a recess 208 is formed by etching the substrate exposed by the etched first insulation layer 206. At this time, the recess 208 is formed with a depth of approximately 1100 Å to approximately 1300 Å. Two recesses are formed in one active region, and one recess is formed in the isolation layer 204. After forming the recess 208, a barrier metal layer 210 is deposited along the exposed surface of the semiconductor substrate 202 including the recess 208. Herein, the barrier metal layer 210 includes tungsten nitride (TiN). Although it is not shown, after forming the recess 208 and before forming the barrier metal layer 210, a channel region is formed under the recess 208 through ion implantation, and a gate insulation layer is formed on a sidewall and the bottom of the recess 208.

Figure 2C:
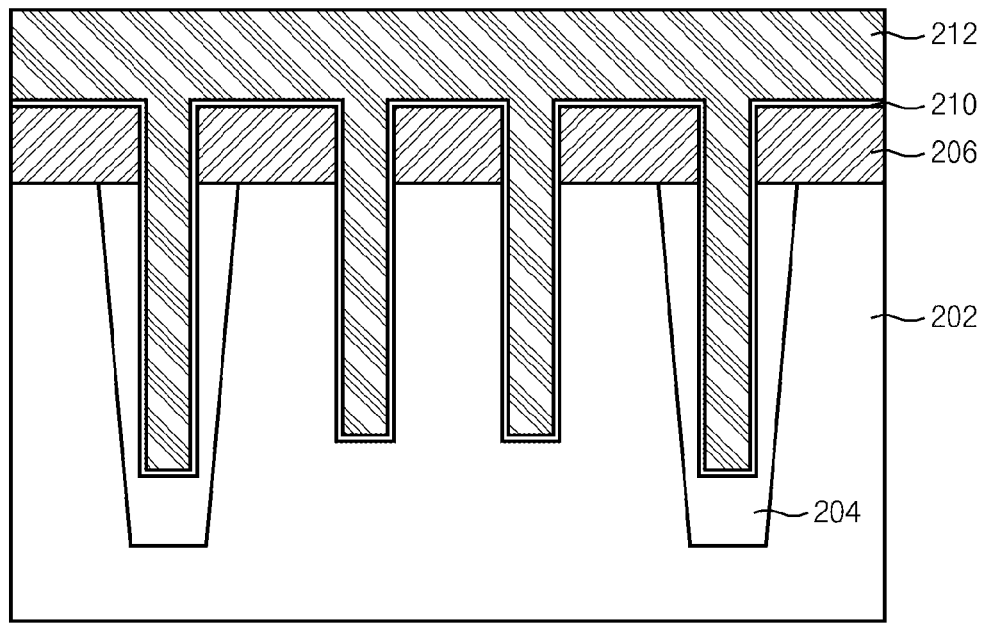

Referring to FIG. 2c, a conductive material is deposited on the barrier metal layer 210 in a certain thickness so that the recess 208 is filled with a conductive layer 212. At this time, the conductive layer 212 may include metallic material such as tungsten (W). Compared polysilicon that is used as a common gate material, metallic material is advantageous in securing a threshold voltage margin of the gate using the difference of physical properties related to the charge migration between metal and silicon.

Figure 2D:
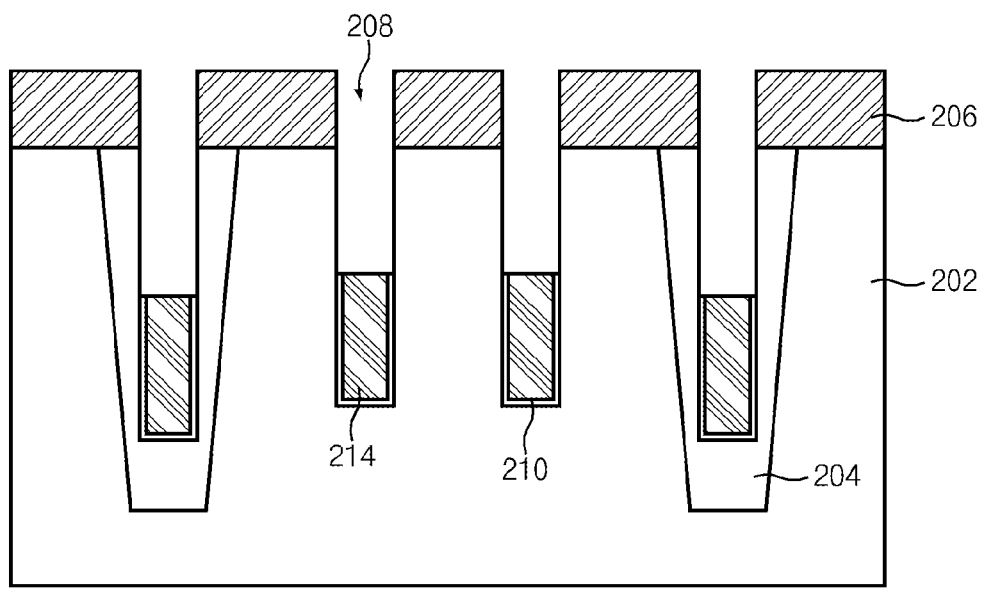

Referring to FIG. 2d, a buried gate 214 is formed in the lower portion of the recess 208 by performing an etch-back process to etch the conductive layer 212. At this time, an etch target depth of the etch-back process may be in a range of approximately 300 Å to approximately 400 Å. Therefore, the buried gate 214 is formed in a depth from a range of approximately 1100 Å to approximately 1300 Å to a range of approximately 300 Å to approximately 400 Å from the surface of the semiconductor substrate 202. To remove metal residue on the sidewall of the recess 208, a cleaning process is performed after the etch-back process.

Figure 2E:
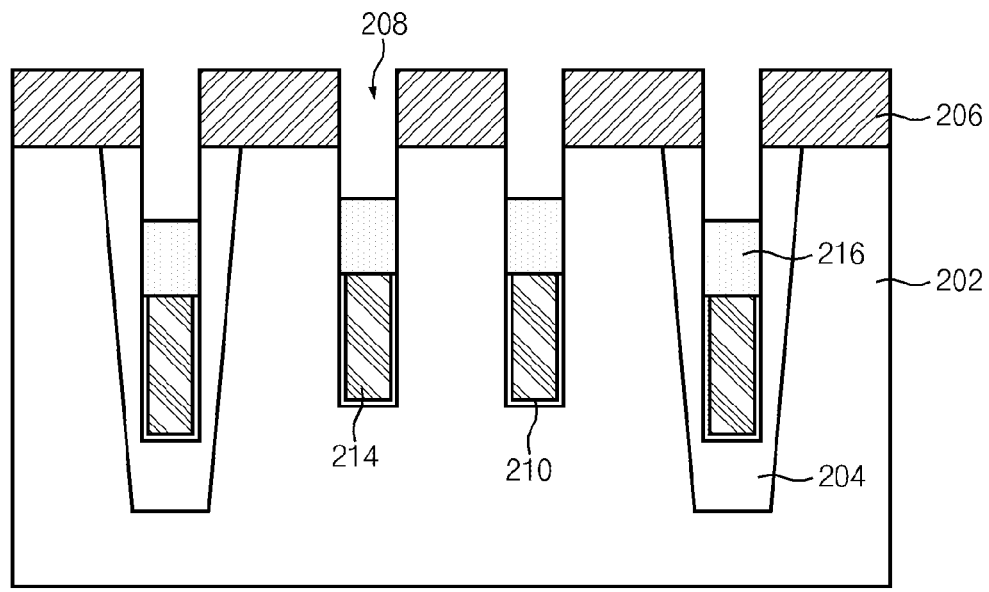

Referring to FIG. 2e, a second insulation layer 216 is formed on the buried gate 214 in the recess 208. A process of forming the second insulation layer 216 is similar to the process of forming the buried gate 214. First of all, after depositing insulating material in a certain thickness, an etch-back process is performed to remain the insulating material on the buried gate 214 in a given thickness. Herein, the second insulation layer 216 may include an oxide layer or a nitride layer. Since the thickness of the second insulation layer 216 is determined through the etch-back process, the thickness of the second insulation layer 216 may be more effectively controlled by forming the second insulation layer 216 with an insulating material whose etch rate is different from that of the first insulation layer 206. Moreover, the second insulation layer 216 should be formed to have a thickness of at least 10 Å to 200 Å, and the thickness should be controlled to reduce a leakage current including gate-induced drain leakage (GIDL) caused by an electric field generated at the sidewall of the recess 208 and the parasitic capacitance generated between a bit line or a source/drain region and the buried gate 214. For instance, the thickness of the second insulation layer 216 may be determined depending on the maximum depth of ion implantation of the source/drain region or the extent that the ion implantation junction is able to extend when data is stored in a storage node.

Figure 2F:
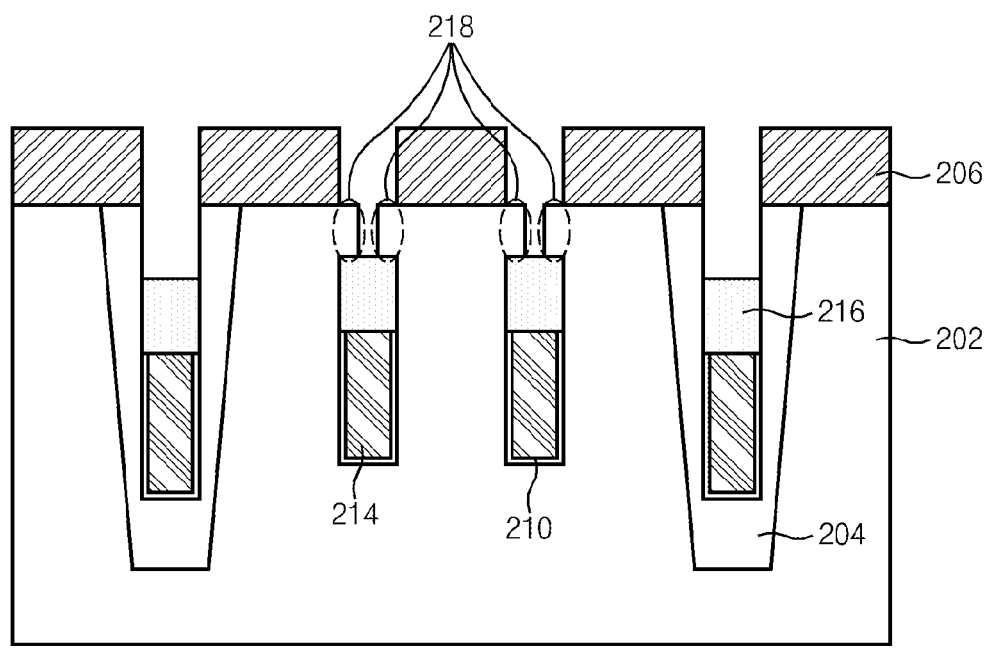

Referring to FIG. 2f, after performing a cleaning process to remove the residue in the recess 208, a silicon growth region 218 is formed by selectively growing silicon on the exposed sidewall of the recess 208 (i.e., using an epitaxial growth process). For example, the recess 208 formed in the cell region of the semiconductor memory apparatus has the minimum line width below that of a given design rule, and the line width of the recess 208 may be reduced as much as approximately 50% by the epitaxial-growth. At this time, since silicon of the recess 208 formed in the isolation layer 204 does not grow, there is no change in the line width of the recess 208 in the isolation layer 204.

Figure 2G:
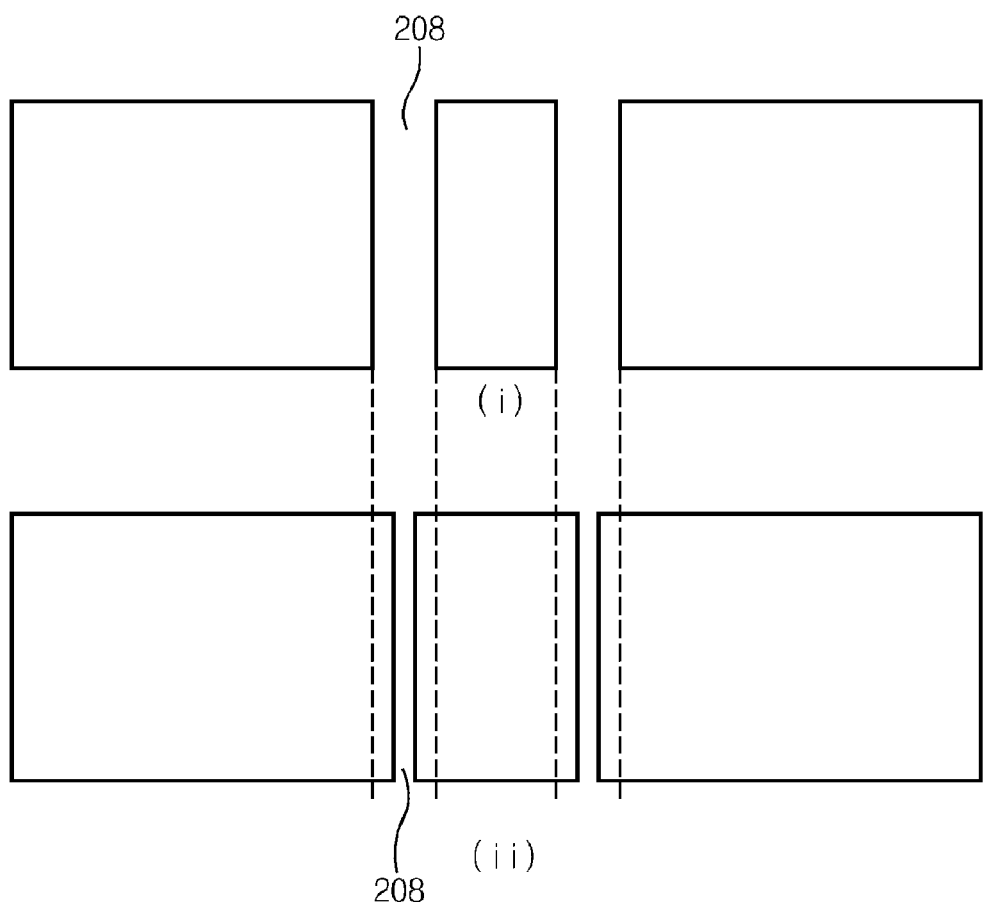
Figure 2H:
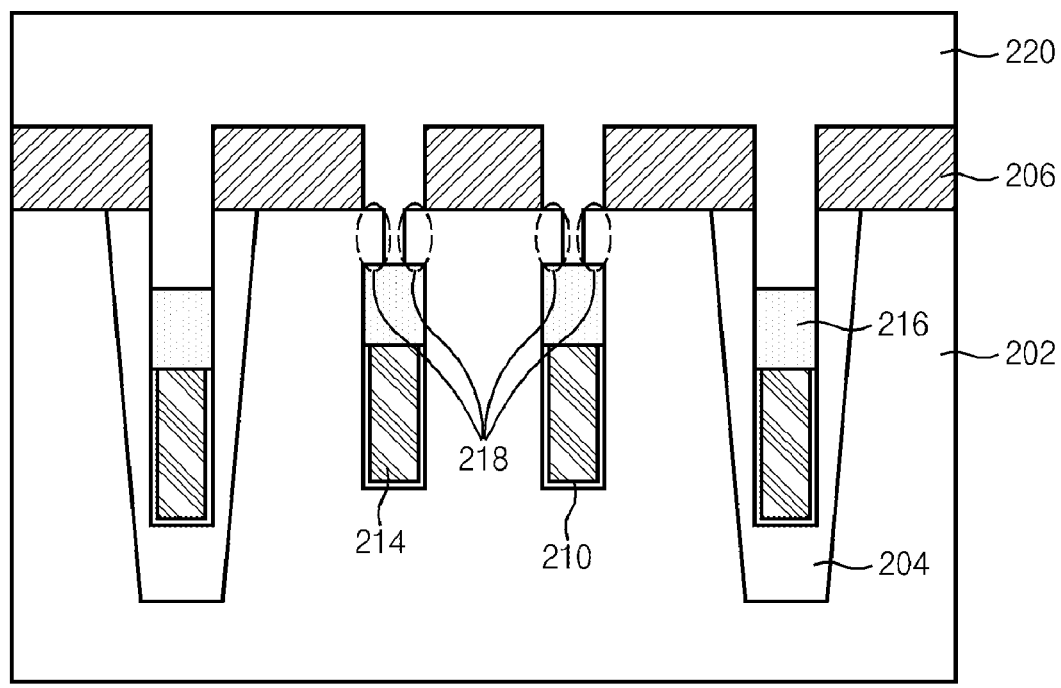

FIG. 2g is a plan view for explaining the change of the active region before (i) and after (ii) the selective epitaxial-grow process. From FIG. 2g, it is noticed that the line width of the two recesses 208 formed in the active region are reduced. Herein, the line width may be reduced as much as approximately 50%, and, in other case, it may be reduced by maximum 70% to 80%. However, when growing the silicon, the recess 208 in the active region should not be fully filled up by the growth of both sidewalls.

Referring to FIG. 2f, a third insulation layer 220 is formed in the remaining empty space of the recess 208 and on the first insulation layer 206. Subsequently, although it is not shown, the top surface of the active region is partially exposed by etching a portion of the first insulation layer 206 and that of the third insulation layer 220; a bit line contact is formed to be coupled between two neighboring buried gates 214; and a storage node contact is formed between the buried gate 214 and the isolation layer 204. A bit line is formed on the bit line contact, and the capacitor is formed on the storage node contact. Detailed description thereof is omitted herein since it is well known to those skilled in the art.

As described above, the method for fabricating the semiconductor device in accordance with the embodiment of the present invention forms the buried gate by forming the recess in the semiconductor substrate, the gate under the recess, and the insulation layer on the gate. Then, after narrowing the upper portion of the recess by growing the exposed silicon without filling the recess with the insulation layer, the remaining empty portion of the recess is filled with the insulation layer. As a result of the above processes, the source/drain region formed at the upper portion of the active region is widened, and the processing margin is increased when forming the contact directly coupled with the source/drain region. Furthermore, it is possible to remove metal residue that may remain on the sidewall of the recess by performing the cleaning process once more on the sidewall of the recess before growing the silicon. The semiconductor device fabricated by the above method includes the gate formed in the recess, the insulation layer formed on the gate in the recess, and the source/drain region having the silicon region extending onto the insulation layer in the recess and onto the semiconductor substrate.

In accordance with the embodiment of the present invention, since the silicon extends onto the insulation layer after forming the buried gate in the active region and then the insulation layer on the buried gate, when forming the contact directly coupled with the source/drain region of the active region, it is possible to overcome a defect that the top surface area of the active region is narrowed by the recess where the buried gate is formed, and to increase the process margin for forming the contact.

Moreover, the cleaning process for exposing the silicon on the sidewall of the recess is performed before growing the silicon on the sidewall of the upper portion of the recess remaining after forming the insulation layer and the buried gate in the recess. Since the conductive material remaining on the sidewall of the recess that may deteriorate the operational stability of the semiconductor device is removed through the cleaning process, it is possible to substantially prevent the buried gate from being electrically connected with the contact.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor apparatus, the method comprising:
   forming a recess in a semiconductor substrate, the recess having a lower portion and an upper portion;
   forming a gate in the lower portion of the recess;
   forming a first insulation layer over the gate and in the upper portion of the recess;
   forming a silicon growth region using an epitaxial growth method, the silicon growth region having a lateral extension, the lateral extension being provided over the first insulation layer in the recess and extending laterally in the recess from the semiconductor substrate through a sidewall of the recess; and
   forming a second insulating layer on the first insulating layer.

2. The method of claim 1, where the step of forming the silicon growth region comprises:
   cleaning the sidewall of the recess to expose a silicon surface of the sidewall of the recess; and
   selectively growing silicon material on the exposed silicon surface.

3. The method of claim 1, wherein the step of forming the gate in the lower portion of the recess comprises:
   depositing conductive material in the recess, the conductive material filling the lower portion and the upper portion of the recess;
   performing an etch-back process to remove the conductive material in the upper portion of the recess; and
   cleaning the upper portion of the recess.

4. The method of claim 1, further comprises depositing a barrier metal layer in the recess, the barrier metal layer being provided between the gate and the surface of the recess.

5. The method of claim 4, wherein the barrier metal layer includes tungsten nitride, and the gate includes tungsten.

6. The method of claim 1, wherein the step of forming of the first insulation layer over the gate comprises:
   depositing an insulating material over the gate;
   removing the insulating material using an etch-back process until the insulating material is provided with a given thickness, thereby forming the first insulation layer; and
   cleaning the recess after the etch-back process.

7. The method of claim 1, wherein the first insulation layer includes an oxide layer or a nitride layer, and a thickness of the first insulation layer is at least 10 Å.

8. The method of claim 1, wherein a lowermost surface of the gate extends vertically downward to 1100 Å to 1300 Å from an uppermost surface of the semiconductor substrate, and an uppermost surface of the gate vertically extends downward to approximately 300 Å to approximately 400 Å from the uppermost surface of the semiconductor substrate.

9. The method of claim 1, wherein the lateral extension of the silicon growth region is configured to reduce a width of an opening of the recess.

10. A semiconductor device, comprising:
    a gate formed in a recess that is formed in a semiconductor substrate;
    an insulation layer formed over the gate in the recess;
    a silicon growth region obtained by an epitaxial growth method, the silicon growth region having a lateral extension provided over the insulation layer and extending laterally into the recess from the semiconductor substrate through a sidewall of the recess: and
    a second insulating layer formed on the insulating layer.

11. The semiconductor device of claim 10, wherein a thickness of the insulation layer is at least 10 Å.

12. The semiconductor device of claim 10, wherein the recess has a depth of 1100 Å to 1300 Å, and an uppermost surface of the gate is provided at a depth of 300 Å to 400 Å.

13. The semiconductor device of claim 10, further comprising a barrier metal layer provided between the gate and a surface of the recess, wherein the gate includes tungsten and the barrier metal layer includes tungsten nitride.

14. The semiconductor apparatus of claim 10, wherein the lateral extension of the silicon growth region is configured to reduce a line width of the recess by up to 80% of the line width.

* * * * *